(12) United States Patent
Li et al.

(10) Patent No.: US 9,187,635 B2
(45) Date of Patent: Nov. 17, 2015

(54) HALOGEN-FREE RESIN COMPOSITION, COPPER CLAD LAMINATE USING THE SAME, AND PRINTED CIRCUIT BOARD USING THE SAME

(71) Applicant: ELITE ELECTRONIC MATERIAL (ZHONGSHAN) CO.,LTD, Guangdong Province (CN)

(72) Inventors: Chang-Yuan Li, Guangdong Province (CN); Yi-Jen Chen, Taoyuan County (TW); Hong-Xia Peng, Guangdong Province (CN)

(73) Assignee: ELITE ELECTRONIC MATERIAL (ZHONGSHAN) CO., LTD., Guangdong Province (CN)

( * ) Notice: Subject to any disclaimer, the term of this patent is extended or adjusted under 35 U.S.C. 154(b) by 39 days.

(21) Appl. No.: 13/827,911

(22) Filed: Mar. 14, 2013

(65) Prior Publication Data

US 2014/0178656 A1    Jun. 26, 2014

(30) Foreign Application Priority Data

Dec. 20, 2012 (CN) .......................... 2012 1 0560623

(51) Int. Cl.
| | |
|---|---|
| *B32B 27/38* | (2006.01) |
| *C08L 79/04* | (2006.01) |
| *H05K 1/03* | (2006.01) |
| *C08L 63/00* | (2006.01) |
| *C08L 35/00* | (2006.01) |
| *C09D 163/00* | (2006.01) |

(52) U.S. Cl.
CPC .................. *C08L 63/00* (2013.01); *C08L 35/00* (2013.01); *C09D 163/00* (2013.01); *H05K 1/0353* (2013.01); *Y10T 428/24917* (2015.01); *Y10T 428/31529* (2015.04)

(58) Field of Classification Search
None
See application file for complete search history.

(56) References Cited

U.S. PATENT DOCUMENTS

| | | | |
|---|---|---|---|
| 6,509,414 B2 | 1/2003 | Tikart et al. | |
| 6,596,373 B1 * | 7/2003 | Kishi et al. | ..................... 428/116 |
| 7,897,258 B2 | 3/2011 | Tikart et al. | |
| 2004/0075802 A1 * | 4/2004 | Kitamura et al. | ............. 349/153 |
| 2012/0024580 A1 * | 2/2012 | Hsu et al. | ....................... 174/258 |
| 2013/0273796 A1 * | 10/2013 | Su et al. | .......................... 442/59 |

FOREIGN PATENT DOCUMENTS

CN          102134375          *    7/2011

* cited by examiner

*Primary Examiner* — Coris Fung
(74) *Attorney, Agent, or Firm* — WPAT, P.C.; Anthony King; Kay Yang

(57) ABSTRACT

A halogen-free resin composition includes (A) 100 parts by weight of epoxy resin; (B) 10 to 100 parts by weight of styrene-maleic anhydride (SMA) copolymer; and (C) 5 to 50 parts by weight of bisphenol S. The halogen-free resin composition includes specific ingredients, and is characterized by specific proportions thereof, to thereby achieve a high glass transition temperature, high heat resistance, and attractive appearance, and thus is suitable for producing a prepreg or resin film to thereby be applicable to copper clad laminates and printed circuit boards.

8 Claims, No Drawings

HALOGEN-FREE RESIN COMPOSITION, COPPER CLAD LAMINATE USING THE SAME, AND PRINTED CIRCUIT BOARD USING THE SAME

CROSS-REFERENCE TO RELATED APPLICATION

This non-provisional application claims priority under 35 U.S.C. §119(a) on Patent Application No(s). 201210560623.5 filed in China on Dec. 20, 2012, the entire contents of which are hereby incorporated by reference.

FIELD OF THE INVENTION

The present invention relates to halogen-free resin compositions, and more particularly, to a halogen-free resin composition applicable to copper clad laminates and printed circuit boards.

BACKGROUND OF THE INVENTION

To get in line with the global trend of environmental protection, and eco-friendly regulations, electronic product manufacturers nowadays are developing, and manufacturing halogen-free electronic products. Advanced countries, and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts, and components. A printed circuit board (PCB) is an indispensable, and fundamental basis of the semiconductor industry, and electronic industry; hence, printed circuit boards bore the brunt of international halogen-free regulations when international organizations set forth strict requirements of the halogen content of printed circuit boards. For example, the International Electrotechnical Commission (IEC) 6 1249-2-21 requires that bromide content, and chloride content shall be less than 900 ppm, and the total halogen content shall be less than 1500 ppm. The Japan Electronics Packaging, and Circuits Association (JPCA) requires that both bromide content, and chloride content shall be less than 900 ppm. To enforce its green policies, Greenpeace calls on manufacturers worldwide to get rid of polyvinyl chloride (PVC), and brominated flame retardants (BFRs) from their electronic products in order to conform with the lead-free, and halogen-free requirements of green electronics. Hence, the industrial sector nowadays is interested in rendering related materials halogen-free, and sees this technique as one of its key research topics.

Electronic products nowadays have the trend toward compactness, and high-frequency transmission; hence, circuit boards nowadays typically feature a high-density layout, and increasingly strict material requirements. To mount high-frequency electronic components on a circuit board, it is necessary that the substrate of the circuit board is made of a material of a low dielectric constant (Dk), and dielectric dissipation factor (Df) in order to maintain the transmission speed, and the integrity of a signal transmitted. To allow the electronic components to operate well at a high temperature, and a high-humidity environment, it is necessary for the circuit board to be heat resistant, fire resistant, and of low hygroscopicity. Epoxy resin is adhesive, heat resistant, and malleable, and thus is widely applicable to encapsulants, and copper clad laminates (CCL) of electronic components, and machinery. From the perspective of fire prevention, and safety, any applicable material is required to be capable of flame retardation. In general, epoxy resin is incapable of flame retardation, and thus epoxy resin has to acquire flame retardation capability by including a flame retardant therein. For example, a halogen, especially bromine, is included in epoxy resin to bring about flame retardation capability of epoxy resin, and enhance the reactivity of the epoxy group.

A conventional circuit board manufacturing method, such as a conventional method of manufacturing a copper-clad substrate (also known as copper clad laminate, CCL), involves heating, and combining a reinforcement material (such as a glass fiber fabric), and a thermosetting resin composition made of an epoxy resin, and a curing agent to form a prepreg, and then laminating the prepreg, and the upper and lower copper foils together at a high temperature, and a high pressure. The prior art usually teaches using a thermosetting resin composed of an epoxy resin, and a hydroxyl-containing phenol novolac resin curing agent. However, phenol novolac resin exhibits so high a reactivity that it is flawed with an overly short expiration period when used as latex paint, not to mention that it is difficult to store and intolerant to heat.

U.S. Pat. No. 6,509,414 and U.S. Pat. No. 7,897,258 disclose a resin composition comprising a styrene-maleic anhydride (SMA) copolymer functioning as a co-crosslinking agent, an epoxy resin, and a co-crosslinking agent. The resin composition is characterized in that the co-crosslinking agent comprises an optionally brominated bisphenol A (BPA), an optionally brominated bisphenol A diglycidyl ether (BPADGE), or a mixture thereof, wherein the resin composition is free from an allyl network forming compound. The co-crosslinking agent is, for example, tetrabromobisphenol A (TBBPA), tetrabromobisphenol A diglycidyl ether (TBBPADGE), or a mixture thereof, such that the resin composition exhibits a high degree of thermal stability and high glass transition temperature (Tg). However, with the bisphenol A bromide functioning as the co-crosslinking agent for styrene-maleic anhydride (SMA) copolymer, the resin composition is flawed disadvantageously with an overly low glass transition temperature Tg.

Accordingly, it is important for printed circuit board material suppliers to develop halogen-free materials of a high glass transition temperature and high heat resistance, and apply the materials to printed circuit board manufacturing.

SUMMARY OF THE INVENTION

In view of the aforesaid drawbacks of the prior art, the inventor of the present invention conceived room for improvement in the prior art and thus conducted extensive researches and experiments according to the inventor's years of experience in the related industry, and finally developed a halogen-free resin composition as disclosed in the present invention to achieve a high glass transition temperature and high heat resistance.

It is an objective of the present invention to provide a halogen-free resin composition comprising specific ingredients, and characterized by specific proportions thereof so as to achieve a high glass transition temperature, high heat resistance, and attractive appearance. The halogen-free resin composition is suitable for producing a prepreg or a resin film, and thus applicable to copper clad laminates and printed circuit boards.

In order to achieve the above and other objectives, the present invention provides a halogen-free resin composition, comprising: (A) 100 parts by weight of epoxy resin; (B) 10 to 100 parts by weight of styrene-maleic anhydride (SMA) copolymer; and (C) 5 to 50 parts by weight of bisphenol S.

The resin composition of the present invention is for use in manufacturing prepregs, resin film, copper clad laminates, and printed circuit boards. Hence, the halogen-free resin composition of the present invention comprises specific ingredients, and is characterized by specific proportions thereof, so as to achieve a high glass transition temperature, high heat resistance, and attractive appearance.

As regards the halogen-free resin composition of the present invention, the ingredient (A) epoxy resin is one, or a combination, of: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, phosphorus-containing epoxy resin, DOPO epoxy resin, DOPO-HQ epoxy resin, p-xylene epoxy resin, naphthalene epoxy resin, benzopyran epoxy resin, biphenyl phenol novolac epoxy resin, isocyanate modified epoxy resin, phenol benzaldehyde epoxy resin, and phenol aralkyl novolac epoxy resin. The DOPO epoxy resin includes DOPO-PN epoxy resin, DOPO-CNE epoxy resin, and DOPO-BPN epoxy resin. The DOPO-HQ epoxy resin includes DOPO-HQ-PN epoxy resin, DOPO-HQ-CNE epoxy resin, and DOPO-HQ-BPN epoxy resin.

As regards the halogen-free resin composition of the present invention, the styrene (S) to maleic anhydride (MA) ratio of the ingredient (B) styrene-maleic anhydride (SMA) copolymer is, for example, 1/1, 2/1, 3/1, 4/1, 6/1 or 8/1, and the ingredient (B) styrene-maleic anhydride (SMA) copolymer is commercially available with brand names, such as SMA-1000, SMA-2000, SMA-3000, EF-30, EF-40, EF-60, and EF-80 manufactured by Sartomer. Moreover, the styrene-maleic anhydride (SMA) copolymer can also be an esterified styrene-maleic anhydride (SMA) copolymer which is commercially available with brand names, such as SMA1440, SMA17352, SMA2625, SMA3840, and SMA31890. The halogen-free resin composition of the present invention includes one, or a combination, of the aforesaid types of styrene maleic anhydride copolymers.

As regards the halogen-free resin composition of the present invention, given 100 parts by weight of epoxy resin, 10 to 100 parts by weight of styrene-maleic anhydride (SMA) copolymer is added thereto, wherein the content of the styrene-maleic anhydride (SMA) copolymer thus added allows the halogen-free resin composition to achieve the expected high glass transition temperature. If less than 10 parts by weight of the styrene-maleic anhydride (SMA) copolymer is added, the expected high glass transition temperature will not be achieved. If more than 100 parts by weight of the styrene-maleic anhydride (SMA) copolymer is added, the prepreg made from the resin composition will manifest poor prepreg appearance and tendency to peel off, thereby deteriorating the prepreg's conforming rate during the manufacturing process thereof. Specifically speaking, preferably, 10 to 50 parts by weight of the styrene-maleic anhydride (SMA) copolymer is added in order to prepare the halogen-free resin composition of the present invention.

As regards the halogen-free resin composition of the present invention, the ingredient (C) bisphenol S is a bis(4-hydroxyphenyl) sulfone having a molecular structure with two hydroxyl groups and a strong electron-withdrawing sulfonyl group and is commercially available with brand names, such as A17342 and B0495 which are manufactured by Energy Chemical.

As regards the halogen-free resin composition of the present invention, given 100 parts by weight of epoxy resin, 5 to 50 parts by weight of bisphenol S is added thereto, wherein the content of the bisphenol S thus added allows the bisphenol S to exhibit, in conjunction with the styrene-maleic anhydride (SMA) copolymer, enhanced cross-linking and laminate characteristics for example, a higher glass transition temperature and higher resin heat resistance, and improved prepreg appearance. A typical phenol crosslinking agent reacts fast with the styrene-maleic anhydride (SMA) copolymer and thus compromises prepreg appearance. The bisphenol S contains a strong electron-withdrawing sulfonyl group and thus reduces the reactivity of the two hydroxyl groups at the terminal end of the bisphenol S; hence, its cross-linking with the styrene-maleic anhydride (SMA) copolymer improves prepreg appearance. If less than 5 parts by weight of the bisphenol S is added, the expected glass transition temperature and heat resistance of the halogen-free resin composition will not be achieved. If more than 50 parts by weight of the bisphenol S is added, not only will the hydroxyl groups of the resin composition tend to remain, but the laminate heat resistance will also decrease. Specifically speaking, preferably, 10 to 30 parts by weight of bisphenol S is added in order to prepare the halogen-free resin composition of the present invention.

The halogen-free resin composition of the present invention further comprises benzoxazine resin. The benzoxazine resin is one, or a combination, of: bisphenol A benzoxazine resin, bisphenol F benzoxazine resin, and phenolphthalein benzoxazine resin. Specifically speaking, preferably, the benzoxazine resin has at least one of the formulas (1) through (3) as follows:

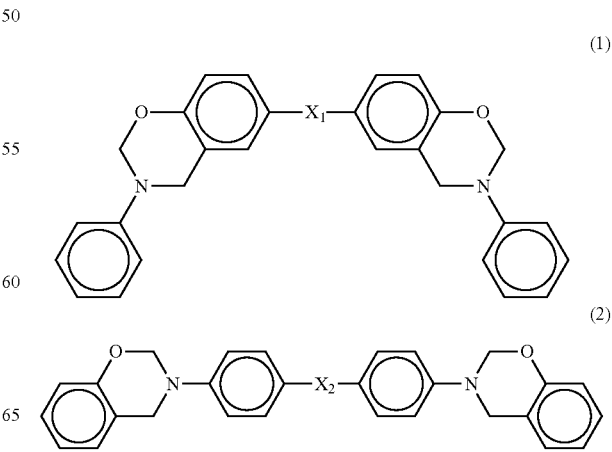

-continued

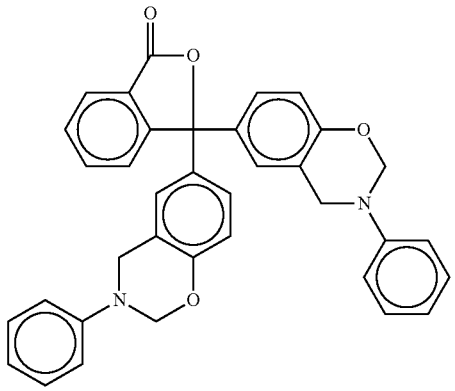

(3)

wherein $X_1$ and $X_2$ are independent of each other and denote R, Ar, or —$SO_2$—; R is one of —C(CH$_3$)$_2$—, —CH(CH$_3$)—, —CH$_2$— and substituted or unsubstituted dicyclopentadiene (DCPD); Ar is one of substituted or unsubstituted benzene, biphenyl, naphthalene, novolac, bisphenol A, bisphenol A novolac, bisphenol F, and bisphenol F novolac functional group which are marketed under the brand names LZ-8270, LZ-8280, and LZ-8290 by Huntsman.

As regards the halogen-free resin composition of the present invention, given 100 parts by weight of epoxy resin, 10 to 100 parts by weight of benzoxazine resin is added thereto, wherein the content of the benzoxazine resin thus added allows the halogen-free resin composition to ensure that board rupture will not occur to a pressure cooking test (PCT) of a heat resistance test, performed on a laminate. If less than 10 parts by weight of benzoxazine resin is added, the expected PCT heat resistance will not be achieved. If more than 100 parts by weight of benzoxazine resin is added, the heat resistance of laminates produced from the resin composition will deteriorate. Specifically speaking, preferably, 20 to 80 parts by weight of benzoxazine resin is added in order to prepare the aforesaid halogen-free resin composition of the present invention.

The halogen-free resin composition of the present invention further comprises a halogen-free flame retardant. The halogen-free flame retardant is a nitrogen-containing flame retardant or a phosphorus-containing flame retardant. A compound added to the halogen-free flame retardant includes, but is not limited to, at least one of the following: bisphenol diphenyl phosphate, ammonium poly phosphate, hydroquinone bis-(diphenyl phosphate), bisphenol A bis-(diphenylphosphate), tri(2-carboxyethyl) phosphine (TCEP), tris(chloroisopropyl) phosphate, trimethyl phosphate (TMP), dimethyl methyl phosphonate (DMMP), resorcinol dixylenylphosphate (RDXP, such as SPB-100), phosphazene (such as SPB-100), m-phenylene methylphosphonate (PMP), melamine polyphosphate, melamine cyanurate, and tri-hydroxy ethyl isocyanurate. Furthermore, the halogen-free flame retardant can also be 9,10-dihydro-9-oxa-10-phosphaphenanthrene-10-oxide (DOPO), DOPO-containing phenol resin (such as DOPO-HQ, DOPO-PN, or DOPO-BPN), DOPO-containing epoxy resin, or DOPO-HQ epoxy resin, wherein DOPO-BPN can be bisphenol novolac, such as DOPO-BPAN, DOPO-BPFN, or DOPO-BPSN.

As regards the halogen-free resin composition of the present invention, given 100 parts by weight of epoxy resin, 10 to 100 parts by weight of a halogen-free flame retardant is added thereto, wherein the content of the halogen-free flame retardant thus added allows the halogen-free resin composition to attain flame retardation. If less than 10 parts by weight of the halogen-free flame retardant is added, the expected flame retardation of the halogen-free resin composition will not be attained. If more than 100 parts by weight of the halogen-free flame retardant is added, the copper clad laminates manufactured in accordance with the resin composition will exhibit increased hygroscopicity and deteriorated heat resistance.

The halogen-free resin composition of the present invention further comprises one, or a combination, of an inorganic filler, a curing accelerator, a silane coupling agent, a toughening agent, and a solvent.

The purpose of adding an inorganic filler to the halogen-free resin composition of the present invention is to enable the resin composition to exhibit enhanced thermal conductivity, improved thermal expansion properties, and enhanced mechanical strength. Preferably, the inorganic filler is uniformly distributed in the resin composition. The inorganic filler comprises silicon dioxide (fused, non-fused, porous, or hollow), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcinated talc, talc, silicon nitride, and/or calcinated kaolin clay. The inorganic filler is spherical, fiber-like, plate-like, particle-like, sheet-like, or needle-shaped, and is selectively pretreated with a silane coupling agent.

The inorganic filler comprises particulate powder with a particle diameter of less than 100 nm, preferably particulate powder with a particle diameter of 1 nm to 20 μm, and most preferably nanoscale particulate powder with a particle diameter of less than 1 μm. The needle-shaped inorganic filler comprises powder with a diameter of less than 50 μM and a length of 1 to 200 μm.

As regards the halogen-free resin composition of the present invention, given 100 parts by weight of an epoxy resin, 10 to 1000 parts by weight of the inorganic filler is added thereto. If less than 10 parts by weight of the inorganic filler is added to resin composition, the resultant resin composition will lack significant thermal conductivity, improved thermal expansion, and enhanced mechanical strength. In case more than 1000 parts by weight of the inorganic filler is added to the resin composition, the resultant resin composition will manifest deteriorated porosity flow and deteriorated copper foil attachment.

The curing accelerator of the present invention comprises a catalyst, such as a lewis base or a lewis acid. The lewis base includes imidazole, boron trifluorideamine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), and/or 4-dimethylaminopyridine (DMAP). The lewis acid comprises metallic salt compounds, such as the metallic salts of manganese, iron, cobalt, nickel, copper, and zinc, namely metallic catalysts, such as zinc caprylate, and cobalt caprylate.

The silane coupling agent comprises silanes and siloxanes which are of the following types, namely amino silane, amino siloxane, epoxy silane, and epoxy siloxane, according to functional group.

The toughening agent of the present invention comprises rubber resin, carboxyl-terminated butadiene acrylonitrile (CTBN) rubber, and/or core-shell rubber.

The solvent of the present invention comprises methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether, or a mixture thereof.

The halogen-free resin composition of the present invention further comprises at least one selected from the group consisting of: phenol resin, phenol novolac resin, polyphenylene ether resin, cyanate ester resin, isocyanate ester resin, maleimide, polyester resin, styrene resin, butadiene resin, phenoxy resin, polyamide, and polyimide.

Another objective of the present invention is to provide a prepreg (PP) characterized by a low dielectric constant, a low dielectric dissipation factor, heat resistance, fire resistance, and low hygroscopicity, and being halogen-free. Accordingly, the prepreg of the present invention comprises a reinforcing material and the aforesaid halogen-free resin composition, wherein the halogen-free resin composition is attached to the reinforcing material and heated up at a high temperature to become semi-cured. The reinforcing material is a fibrous material, a woven fabric, or a non-woven fabric, such as a glass fiber fabric, and is intended to increase the mechanical strength of the prepreg. Also, the reinforcing material can be selectively pretreated with a silane coupling agent or a siloxane coupling agent. For example, the glass fiber fabric is pretreated with the silane coupling agent.

When heated up at a high temperature or heated up at a high temperature and a high pressure, the prepreg can be cured to form a cured prepreg or a solid-state insulating layer, wherein, if the halogen-free resin composition contains a solvent, the solvent will evaporate and escape during a high-temperature heating process.

Another objective of the present invention is to provide a copper-clad laminate which has low dielectric properties, low hygroscopicity, high heat resistance, and high fire resistance, is halogen-free, and is suitable for use with circuit boards dedicated to high-speed, high-frequency signal transmission. Accordingly, the present invention provides a copper-clad laminate comprising at least two copper foils and at least one insulating layer. The copper foils each further comprise an alloy of copper and at least one of aluminum, nickel, platinum, silver, and gold. The insulating layer is formed by curing the prepreg at a high temperature and a high pressure, for example, by compressing the prepreg sandwiched between two pieces of copper foil at a high temperature and a high pressure.

Advantages of the copper-clad laminate of the present invention include, but are not limited to, the following: a low dielectric constant, a low dielectric dissipation factor, low hygroscopicity, high heat resistance, high fire resistance, high thermal conductivity, and being halogen-free. The copper-clad laminate undergoes a wiring fabrication process to enable the manufacturing of a circuit board, wherein, after electronic components have been mounted on and electrically connected to the circuit board, the circuit board operates well even at adverse environments, such as high temperature and high humidity.

Yet another objective of the present invention is to provide a printed circuit board which has low dielectric properties, low hygroscopicity, high heat resistance, and high fire resistance, is halogen-free, and is suitable for use in high-speed, high-frequency signal transmission. The circuit board comprises at least one aforesaid copper-clad laminate and can be manufactured by a conventional process.

The embodiments below further disclose and describe the present invention so as to enable persons skilled in the art to implement the present invention accordingly. The embodiments below are illustrative, rather than restrictive, of the present invention. All equivalent modifications and changes made to the embodiments below by persons skilled in the art without departing from the spirit embodied in the present invention shall fall within the scope of the present invention.

DETAILED DESCRIPTION OF THE PREFERRED EMBODIMENTS

Objectives, features, and advantages of the present invention are hereunder illustrated with specific embodiments as follows:

Embodiment 1 (E1)

A resin composition, comprising ingredients as follows:
(A) 100 parts by weight of DCPD-epoxy resin (HP-7200H);
(B) 70 parts by weight of styrene-maleic anhydride (SMA) copolymer (EF-40);
(C) 30 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

Embodiment 2 (E2)

A resin composition, comprising ingredients as follows:
(A) 100 parts by weight of DCPD-epoxy resin (HP-7200H);
(B) 5 parts by weight of styrene-maleic anhydride (SMA) copolymer (EF-40);
(C) 30 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

Embodiment 3 (E3)

A resin composition, comprising ingredients as follows:
(A) 100 parts by weight of DCPD-epoxy resin (HP-7200H);
(B) 105 parts by weight of styrene-maleic anhydride (SMA) copolymer (EF-40);
(C) 30 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

Embodiment 4 (E4)

A resin composition, comprising ingredients as follows:
(A) 100 parts by weight of DCPD-epoxy resin (HP-7200H);
(B) 70 parts by weight of styrene-maleic anhydride (SMA) copolymer (EF-40);
(C) 3 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

Embodiment 5 (E5)

A resin composition, comprising ingredients as follows:
(A) 100 parts by weight of DCPD-epoxy resin (HP-7200H);
(B) 70 parts by weight of styrene-maleic anhydride (SMA) copolymer (EF-40);
(C) 55 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

Embodiment 6 (E6)

A resin composition, comprising ingredients as follows:
(A) 100 parts by weight of DCPD-epoxy resin (HP-7200H);
(B) 80 parts by weight of styrene-maleic anhydride (SMA) copolymer (EF-40);
(C) 46 parts by weight of bisphenol S (BPS);
(D) 10 parts by weight of benzoxazine resin (LZ 8280);
(E) 50 parts by weight of phosphazene (SPB-100);
(f) 50 parts by weight of fused silica;
(G) 0.3 parts by weight of catalyst (2E4MI); and
(H) 60 parts by weight of methyl ethyl ketone (MEK).

Embodiment 7 (E7)

A resin composition, comprising ingredients as follows:
(A) 100 parts by weight of DCPD-epoxy resin (HP-7200H);
(B) 40 parts by weight of styrene-maleic anhydride (SMA) copolymer (EF-40);
(C) 5 parts by weight of bisphenol S (BPS);
(D) 70 parts by weight of benzoxazine resin (LZ 8280);
(E) 50 parts by weight of phosphazene (SPB-100);
(f) 50 parts by weight of fused silica;
(G) 0.3 parts by weight of catalyst (2E4MI); and
(H) 60 parts by weight of methyl ethyl ketone (MEK).

Comparison 1 (C1)

A resin composition, comprising ingredients as follows:
(A) 100 parts by weight of DCPD-epoxy resin (HP-7200H);
(B) 70 parts by weight of styrene-maleic anhydride (SMA) copolymer (EF-40);
(C) 30 parts by weight of bisphenol A (BPA);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

Comparison 2 (C2)

A resin composition, comprising ingredients as follows:
(A) 100 parts by weight of DCPD-epoxy resin (HP-7200H);
(B) 30 parts by weight of bisphenol S (BPS);
(C) 50 parts by weight of phosphazene (SPB-100);
(D) 50 parts by weight of fused silica;
(E) 0.3 parts by weight of catalyst (2E4MI); and
(f) 60 parts by weight of methyl ethyl ketone (MEK).

Comparison 3 (C3)

A resin composition, comprising ingredients as follows:
(A) 100 parts by weight of DCPD-epoxy resin (HP-7200H);
(B) 70 parts by weight of styrene-maleic anhydride (SMA) copolymer (EF-40);
(C) 50 parts by weight of phosphazene (SPB-100);
(D) 50 parts by weight of fused silica;
(E) 0.3 parts by weight of catalyst (2E4MI); and
(f) 60 parts by weight of methyl ethyl ketone (MEK).

Comparison 4 (C4)

A resin composition, comprising ingredients as follows:
(A) 100 parts by weight of DCPD-epoxy resin (HP-7200H);
(B) 5 parts by weight of styrene-maleic anhydride (SMA) copolymer (EF-40);
(C) 3 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(f) 60 parts by weight of methyl ethyl ketone (MEK).

Comparison 5 (C5)

A resin composition, comprising ingredients as follows:
(A) 100 parts by weight of DCPD-epoxy resin (HP-7200H);
(B) 110 parts by weight of styrene-maleic anhydride (SMA) copolymer (EF-40);
(C) 60 parts by weight of bisphenol S (BPS);
(D) 50 parts by weight of phosphazene (SPB-100);
(E) 50 parts by weight of fused silica;
(f) 0.3 parts by weight of catalyst (2E4MI); and
(G) 60 parts by weight of methyl ethyl ketone (MEK).

The ingredients of the resin composition in embodiments 1 through 7 (E1~E7) are enumerated in Table 1. The ingredients of the resin composition in comparisons 1 through 5 (C1~C5) are enumerated in Table 3.

The ingredients of the resin composition in embodiments 1 through 7 (E1~E7) and comparisons 1 through 5 (C1~C5) are evenly mixed in a blender batch by batch before being put into an impregnation tank. Then, a glass fiber fabric is passed through the impregnation tank to allow the resin composition to adhere to the glass fiber fabric before undergoing a heating and baking process to become semi-cured, thereby forming a prepreg.

A piece of 18-μm copper foil, four pieces of the prepreg prepared by the same batch, and another piece of 18-μm copper foil are stacked in sequence before being laminated against each other in vacuum at 200° C. for two hours to form a copper-clad laminate (CCL). The four pieces of prepreg are cured to form an insulating layer between the two copper foils.

A physical properties measurement process is performed on the non-copper-containing substrate of the etched aforesaid copper clad laminates and copper foils. The physical properties measurement process measures: the glass transition temperature (Tg); copper-clad laminate heat resistance (T288, at constant temperature of 288° C., to measure the duration of heat resistance and absence of board rupture); non-copper-containing laminate PCT solder dip test (pressure cooking test at 121° C., solder dip 288° C. one hour and three hours later, observe for 20 seconds to see whether board rupture occurs, PCT); and prepreg appearance (PP appearance) test (evaluate surface smoothness with the naked eye, smooth surface indicates delivery, coarse surface prevents delivery, because a prepreg with coarse surface compromises pro-lamination properties).

The results of measurement of the resin composition in embodiments 1 through 7 (E1~E7) are shown in Table 2. The results of measurement of the resin composition in comparisons 1 through 5 (C1~C5) are shown in Table 4.

TABLE 1

| ingredient | | E1 | E2 | E3 | E4 | E5 | E6 | E7 |
|---|---|---|---|---|---|---|---|---|
| epoxy resin | HP-7200H | 100 | 100 | 100 | 100 | 100 | 100 | 100 |
| styrene-maleic anhydride (SMA) copolymer | EF-40 | 70 | 5 | 105 | 70 | 70 | 80 | 40 |
| bisphenol S | BPS | 30 | 30 | 30 | 3 | 55 | 46 | 5 |
| benzoxazine resin | LZ-8280 | 0 | 0 | 0 | 0 | 0 | 10 | 70 |
| flame retardant | SPB-100 | 50 | 50 | 50 | 50 | 50 | 50 | 50 |
| inorganic filler | Fused silica | 50 | 50 | 50 | 50 | 50 | 50 | 50 |
| catalyst | 2E4MI | 0.3 | 0.3 | 0.3 | 0.3 | 0.3 | 0.3 | 0.3 |
| solvent | MEK | 60 | 60 | 60 | 60 | 60 | 60 | 60 |

TABLE 2

| property test | method | E1 | E2 | E3 | E4 | E5 | E6 | E7 |
|---|---|---|---|---|---|---|---|---|
| Tg | DSC | 164 | 153 | 179 | 158 | 165 | 168 | 170 |
| T288 (clad) | TMA (min) | >20 | >20 | 5 | 2 | >20 | >20 | >20 |
| PCT (1 hr) | dip 288° C., 20 s | board not ruptured | board not ruptured | board ruptured | board ruptured | board ruptured | board not ruptured | board not ruptured |
| PCT (3 hr) | dip 288° C., 20 s | board ruptured | board ruptured | board ruptured | board ruptured | board ruptured | board not ruptured | board not ruptured |
| PP appearance | with naked eye | smooth | smooth | coarse | coarse | smooth | smooth | smooth |

A comparison of embodiment 1 with embodiments 2, and 3 reveals that the overly small amount of styrene-maleic anhydride (SMA) copolymer in embodiment 2 results in a low glass transition temperature (Tg), and that the overly large amount of styrene-maleic anhydride (SMA) copolymer in embodiment 3 results in unsatisfactory PP appearance and deteriorated laminate heat resistance (T288 and PCT (1 hr)).

A comparison of embodiment 1 with embodiments 4, and 5 reveals that an overly small amount of a crosslinking agent, bisphenol S, of styrene-maleic anhydride (SMA) copolymer in embodiment 4 results in reduced heat resistance and unsatisfactory PP appearance, and that an overly large amount of bisphenol S in embodiment 5 results in increased hygroscopicity and thereby board rupture in PCT (1 hr) test.

A comparison of embodiment 1 with embodiments 6, and 7 reveals that the adding of benzoxazine resin to the resin composition of the present invention in embodiments 6, and 7 accounts for the phenomenon that laminate properties are enhanced because no board rupture happens during the heat resistance test performed after immersion in PCT (3 hr).

TABLE 3

| ingredient | | C1 | C2 | C3 | C4 | C5 |
|---|---|---|---|---|---|---|
| epoxy resin | HP-7200H | 100 | 100 | 100 | 100 | 100 |
| styrene-maleic anhydride (SMA) copolymer | EF-40 | 70 | 0 | 70 | 5 | 110 |
| bisphenol S | BPS | 0 | 30 | 0 | 3 | 60 |
| bisphenol A | BPA | 30 | 0 | 0 | 0 | 0 |
| flame retardant | SPB-100 | 50 | 50 | 50 | 50 | 50 |
| inorganic filler | Fused silica | 50 | 50 | 50 | 50 | 50 |
| catalyst | 2E4MI | 0.3 | 0.3 | 0.3 | 0.3 | 0.3 |
| solvent | MEK | 60 | 60 | 60 | 60 | 60 |

TABLE 4

| property test | method | C1 | C2 | C3 | C4 | C5 |
|---|---|---|---|---|---|---|
| Tg | DSC | 155 | 143 | 135 | 154 | 186 |
| T288 (clad) | TMA (min) | >20 | 13 | 2 | 3 | 7 |
| PCT (1 hr) | dip 288° C., 20 s | board not ruptured | board ruptured | board ruptured | board ruptured | board ruptured |
| PCT (3 hr) | dip 288° C., 20 s | board ruptured | board ruptured | board ruptured | board ruptured | board ruptured |
| PP appearance | with naked eye | smooth | smooth | coarse | smooth | coarse |

A comparison of embodiment 1 with comparisons 1~5 reveals as follows: comparison 1 lacks bisphenol S but employs bisphenol A to thereby decrease the glass transition temperature (Tg) and reduce heat resistance; comparison 2 lacks styrene-maleic anhydride (SMA) copolymer to thereby decrease glass transition temperature (Tg) further and cause board rupture in T288 and PCT (1 hr) test; comparison 3 lacks a crosslinking agent for styrene-maleic anhydride (SMA) copolymer to thereby decrease the glass transition temperature (Tg), reduce heat resistance, and compromise PP appearance; in comparison 4, both the styrene-maleic anhydride (SMA) copolymer and bisphenol S are scarce (just 5 parts by weight of styrene-maleic anhydride (SMA) copolymer, and just 3 parts by weight of bisphenol S) and thus their heat resistance are significantly low; and, in comparison 5, both the styrene-maleic anhydride (SMA) copolymer and bisphenol S are excessive (110 parts by weight of styrene-maleic anhydride (SMA) copolymer, and 60 parts by weight of bisphenol S) and thus their physical properties, heat resistance, and PP appearance are significantly unsatisfactory.

Hence, the present invention meets the three requirements of patentability, namely novelty, non-obviousness, and industrial applicability. Regarding novelty and non-obviousness, the present invention provides a halogen-free resin composition comprising specific ingredients and characterized by specific proportions thereof so as to achieve a high glass transition temperature, high heat resistance, and attractive appearance and thereby be applicable to the manufacturing of prepregs or resin film for use in copper clad laminates and printed circuit boards. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A halogen-free resin composition, comprising:
   (A) 100 parts by weight of epoxy resin;
   (B) 70 to 80 parts by weight of styrene-maleic anhydride (SMA) copolymer; and
   (C) 30 to 46 parts by weight of bisphenol S,
   wherein the epoxy resin is dicyclopentadiene epoxy resin, and wherein a styrene to maleic anhydride ratio of the styrene-maleic anhydride copolymer is 4/1.

2. The halogen-free resin composition of claim 1, further comprising 10 to 100 parts by weight of benzoxazine resin.

3. The halogen-free resin composition of claim 1, further comprising a halogen-free flame retardant being at least one selected from the group consisting of: bisphenol diphenyl phosphate, ammonium poly phosphate, hydroquinone bis-(diphenyl phosphate), bisphenol A bis-(diphenylphosphate), tri(2-carboxyethyl)phosphine (TCEP), tris(chloroisopropyl) phosphate, trimethyl phosphate (TMP), dimethyl methyl phosphonate (DMMP), resorcinol dixylenylphosphate (RDXP), phosphazene, m-phenylene methylphosphonate (PMP), melamine polyphosphate, melamine cyanurate, trihydroxy ethyl isocyanurate, 9,10-dihydro-9-oxa-10-phosphaphenanthrene-10-oxide (DOPO), DOPO-containing phenol resin, DOPO-containing epoxy resin, and DOPO-HQ epoxy resin.

4. The halogen-free resin composition of claim 1, further comprising at least one selected from the group consisting of: an inorganic filler, a curing accelerator, a silane coupling agent, a toughening agent, a crosslinking agent, and a solvent.

5. The halogen-free resin composition of claim 4, further comprising at least one selected from the group consisting of: phenol resin, phenol novolac resin, polyphenylene ether resin, cyanate ester resin, isocyanate ester resin, maleimide, polyester resin, styrene resin, butadiene resin, phenoxy resin, polyamide, polyimide, and modified derivatives thereof.

6. A prepreg, comprising the halogen-free resin composition of claim 1.

7. A copper clad laminate, comprising the prepreg of claim 6.

8. A printed circuit board, comprising the copper clad laminate of claim 7.

* * * * *